United States Patent
Maier

(10) Patent No.: US 10,606,792 B2
(45) Date of Patent: Mar. 31, 2020

(54) INTERFACE ARRANGEMENT ON A SYSTEM BOARD AND COMPUTER SYSTEM

(71) Applicant: Fujitsu Technology Solutions Intellectual Property GmbH, München (DE)

(72) Inventor: Andreas Maier, München (DE)

(73) Assignee: Fujitsu Technology Solutions Intellectual Property GmbH, München (DE)

( * ) Notice: Subject to any disclaimer, the term of this patent is extended or adjusted under 35 U.S.C. 154(b) by 0 days.

(21) Appl. No.: 16/394,236

(22) Filed: Apr. 25, 2019

(65) Prior Publication Data

US 2019/0340149 A1    Nov. 7, 2019

(30) Foreign Application Priority Data

May 2, 2018    (DE) .......................... 20 2018 102 439

(51) Int. Cl.
*H01R 13/66* (2006.01)
*G06F 13/40* (2006.01)
*G06F 13/42* (2006.01)
*G06F 13/10* (2006.01)
(Continued)

(52) U.S. Cl.
CPC ........ *G06F 13/4282* (2013.01); *G06F 13/102* (2013.01); *H05K 1/0245* (2013.01); *H05K 1/181* (2013.01); *G06F 2213/0042* (2013.01); *H05K 2201/10015* (2013.01); *H05K 2201/10022* (2013.01); *H05K 2201/10522* (2013.01)

(58) Field of Classification Search
None
See application file for complete search history.

(56) References Cited

U.S. PATENT DOCUMENTS

2003/0026524 A1*  2/2003  Kakizaki .............. G02B 6/3588
                                                                385/16
2004/0196062 A1   10/2004  Fuller et al.
(Continued)

FOREIGN PATENT DOCUMENTS

DE    10 2011 113 068 B3    2/2013

OTHER PUBLICATIONS

Universal Serial Bus 3.0 Specification, Revision 1.0, Nov. 12, 2008 (Segments 001-003).
(Continued)

*Primary Examiner* — Hyun Nam
(74) *Attorney, Agent, or Firm* — DLA Piper LLP (US)

(57) ABSTRACT

An interface arrangement on a system board includes at least two data lines for a differential signal transmission, at least one first mounting location for at least one first connector and at least one second mounting location for at least one second connector, and a third mounting location for an integrated circuit, wherein at the at least one first mounting location the data lines are divided into first and second paths, at the at least one second mounting location, the second and first paths are joined, the third mounting location for the integrated circuit is arranged in the first path, and the at least one and second connectors can be mounted at the at least one first and second mounting locations in a first or a second position, respectively, so that signals in the data lines run via the first path or via the second path.

11 Claims, 5 Drawing Sheets

(51) Int. Cl.
*H05K 1/02* (2006.01)
*H05K 1/18* (2006.01)

(56) References Cited

U.S. PATENT DOCUMENTS

2007/0032100 A1 2/2007 Yang et al.
2013/0267116 A1* 10/2013 Tin ........................... H02J 1/00
439/535

OTHER PUBLICATIONS

Universal Serial Bus 3.1 Specification, Revision 1.0, Jul. 26, 2013.
Universal Serial Bus 3.2 Specification, Sep. 22, 2017.
TUSB1002 USB3.1 10 Gbps Dual-Channel Linear Redriver, Texas Instruments, Oct. 2017, pp. 25-26, http://www.ti.com/lit/ds/symlink/tusb1002.pdf (Abgerufen am Sep. 1, 2019).

* cited by examiner

INTERFACE ARRANGEMENT ON A SYSTEM BOARD AND COMPUTER SYSTEM

TECHNICAL FIELD

This disclosure relates to an interface arrangement on a system board and a computer system comprising at least one system board with at least one such interface arrangement.

BACKGROUND

Interfaces on system boards are widespread nowadays. For example, motherboards for computer systems usually have interfaces that enable communication between peripheral devices and the computer systems via the interfaces.

Depending on the requirement, different standards are now used in computer systems such as USB 3.0 according to Universal Serial Bus 3.0 Specification, Revision 1.0, dated 12 Nov. 2008, USB 3.1 Generation 1 according to Universal Serial Bus 3.1 Specification, Revision 1.0, dated 26 Jul. 2013, USB 3.1 Generation 2 according to Universal Serial Bus 3.1 Specification, Revision 1.0, dated 26 Jul. 2013, and USB 3.2 according to Universal Serial Bus 3.2 Specification, Revision 1.0, dated 22 Sep. 2017 for USB interfaces. Different standards may differ, for example, in the data transmission rate. The system boards accordingly also have differences depending on which standard is to be supported on an interface.

There is, therefore, a need to reduce a production and cost outlay in the manufacture of such system boards.

SUMMARY

I provide an interface arrangement on a system board (2), including at least two data lines (13) for a differential signal transmission via the interface arrangement, at least one first mounting location (14) for at least one first connector and at least one second mounting location (15) for at least one second connector, and a third mounting location (19) for an integrated circuit, wherein at the at least one first mounting location (14) the data lines (13) are divided into a first path (17) and a second path (18), at the at least one second mounting location (15) the second path (18) and the first path (17) are joined, the third mounting location (19) for the integrated circuit is arranged in the first path (17), and the at least one first connector and the at least one second connector can be mounted at the at least one first and at least one second mounting location (14, 15) in a first or a second position, respectively, so that signals in the data lines (13) run via the first path (17) or via the second path (18).

I also provide a computer system including at least one system board with the at least one interface arrangement on a system board (2), including at least two data lines (13) for a differential signal transmission via the interface arrangement, at least one first mounting location (14) for at least one first connector and at least one second mounting location (15) for at least one second connector, and a third mounting location (19) for an integrated circuit, wherein at the at least one first mounting location (14) the data lines (13) are divided into a first path (17) and a second path (18), at the at least one second mounting location (15) the second path (18) and the first path (17) are joined, the third mounting location (19) for the integrated circuit is arranged in the first path (17), and the at least one first connector and the at least one second connector can be mounted at the at least one first and at least one second mounting location (14, 15) in a first or a second position, respectively, so that signals in the data lines (13) run via the first path (17) or via the second path (18).

REFERENCE SYMBOL LIST

Figure 1:
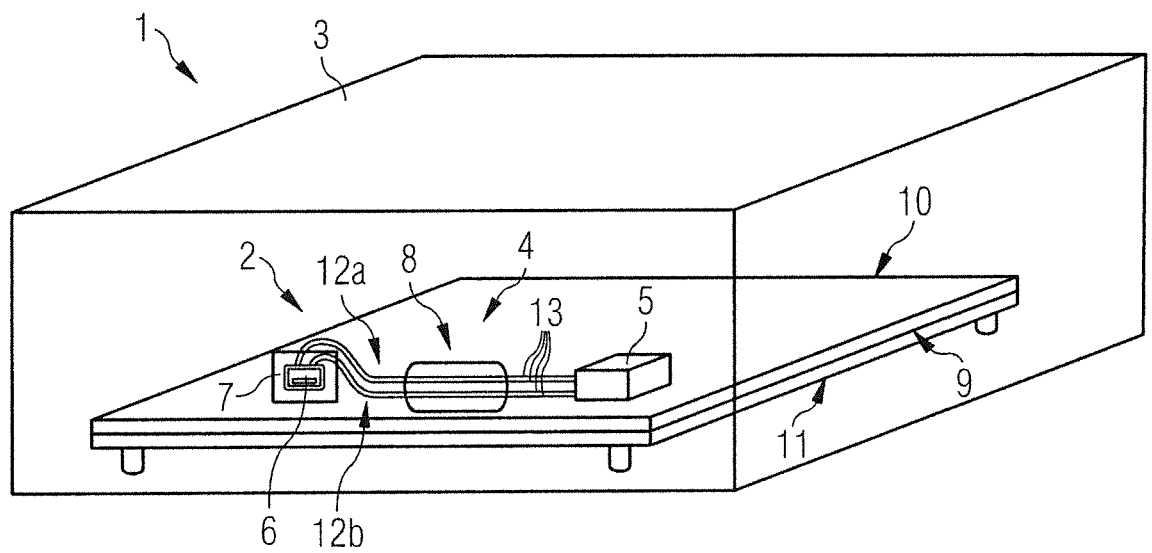
FIG. 1 shows a representation in perspective of a computer system with a system board, on which a USB interface is arranged.

1 Computer system
2 System board
3 Housing
4 USB interface
5 USB host controller
6 USB port
7 Panel
8 Interface circuit
9 Intermediate layer of the system board
10 Upper side of the system board
11 Lower side of the system board
12a First signal path
12b Second signal path
13 Data line
14 First mounting location
15 Second mounting location
16 Common portion
17 First path
18 Second path
19 Third mounting location
20a, 20b, 20c Pad
21 Via
22 Zero-ohm resistor array
23 Retimer
24 Capacitor
A Area
P1, P2 Arrows
BO1 First mounting option
BO2 Second mounting option
L Left side
R Right side

DETAILED DESCRIPTION

I provide an interface arrangement on a system board. The interface arrangement comprises at least two data lines for a differential signal transmission via the interface arrangement. The interface arrangement further comprises at least one first mounting location for at least one first connector, at least one second mounting location for at least one second connector and a third mounting location for an integrated circuit. At the at least one first mounting location, the data lines are divided into a first path and a second path. At the at least one second mounting location, the second path and the first path are brought together. The third mounting location for the integrated circuit is arranged in the first path.

The at least one first connector and the at least one second connector can be mounted on the at least one first and at least one second mounting location, respectively, in a first or a second position so that signals in the data lines run via the first path or via the second path.

It is advantageous that an interface on a system board can be adapted according to a standard to be supported by the interface without a great outlay. Standards with a higher data transmission rate use an additional integrated circuit, for example, to compensate for signal losses in the data lines. This applies with the standard USB 3.1 Generation 2, for example, with which data transmission rates of up to 10 Gigabits per second (Gbit/s) are attained. On the other hand, in the standard USB 3.1 Generation 1, for example, only data transmission rates of up to 5 Gbit/s are reached so that an integrated circuit of this kind can be dispensed with. It is similar, for example, with different specifications for Thunderbolt interfaces, PCI Express interfaces, Serial ATA (Serial AT Attachment) interfaces and similar interfaces with comparably high or higher data transmission rates. My interface arrangement can optionally be equipped with such an integrated circuit. Depending on whether or not such an integrated circuit is used in the interface arrangement, signals in the data lines of the interface arrangement can be routed via the first path or the second path. A uniform system board model can therefore be used, regardless of which standard is to be supported by an interface of the system board. This reduces both production and cost outlays in manufacturing such system boards.

The at least one first connector and/or the at least one second connector may comprise two zero-ohm resistors combined to form a chip resistor array.

The use of a chip resistor array is advantageous since they are easy to handle both manually and by machine so that equipping of the system board with the connector is simplified.

The at least one first connector and/or the at least one second connector may comprise two capacitors.

Capacitors are usually used on system boards in circuits of interface arrangements, for example, for a direct voltage decoupling of the differential data lines. If suitable capacitors are used for the at least one first and/or the at least one second connector, additional components can be saved in the interface arrangement. The two capacitors can be mounted individually on the at least one first or at least one second mounting location, for example, or they are combined in a chip design.

The at least one first mounting location and/or the at least one second mounting location may comprise six pads, wherein the six pads are arranged in two rows of three pads each running parallel to one another. Two central pads are associated with a common portion of the data lines, two pads on a first side are associated with the data lines of the first path and two pads on a second side are associated with the data lines of the second path.

It is possible in this way, using the first or the second connector, to connect the common portion of the data lines either to the first path or to the second path, depending on whether they are mounted in a first or a second position. One advantage in this example is that at the at least one first and the at least one second mounting location, no line ends protrude and no intersections or branchings occur in the lines. The connectors produce a continuous, unbranched transition between the common portion of the data lines and the data lines of the first and the second path. The risk of occurrence of a total reflection, for example, at open line ends, is thus reduced.

I also provide a computer system comprising at least one system board with at least one interface arrangement.

Advantages of the computer system correspond substantially to the advantages of the interface arrangement.

Other advantageous configurations are described in the appended claims and following description of examples. The examples are described by the appended drawings. In the drawings, the same reference signs are used for elements with substantially the same function, but the elements do not have to be identical in all details.

FIG. 1 shows a representation in perspective of a computer system 1 with a system board 2. The system board 2 is arranged in a housing 3 of the computer system 1. In this example the system board 2 is a motherboard of the computer system 1. In an alternative configuration the system board is a USB module, for example, connected to a system board of a computer system, or a PCIe card. The computer system 1 in this example is a desktop computer. Alternatively, the computer system is a laptop, a server, a tablet computer or other electrical device.

The system board 2 has a USB interface 4, via which a data exchange is enabled between the computer system 1 and a peripheral device, which is not shown. The USB interface 4 comprises a USB host controller 5 and a USB port 6. The USB port 6 is a USB Type A or USB Type C port and represents a physical connection for peripheral devices to the USB interface 4 of the computer system 1. The USB port 6 is attached to a panel 7 of the housing 3. Alternatively, the USB interface 4 is adapted to provide an internal USB connection in the computer system 1, via which other components of the computer system 1, which are not shown, can connect to the system board 2. For the purpose of simple description only one USB port 6 is shown. However, the computer system 1 can naturally also have other such USB ports.

The USB host controller 5 is adapted to control a signal transmission via the USB interface 4 among other things and represents a master in the bus system of the USB interface 4. In this example, the USB host controller 5 supports either a signal transmission via the USB interface 4 according to the standard USB 3.1 Generation 1 or according to the standard USB 3.1 Generation 2. The USB host controller 5 is configured accordingly with regard to a standard to be supported by the USB interface 4. Alternatively, it is also possible, depending on which USB standard is to be supported at the USB interface 4, for the system board 2 to be equipped with different USB host controllers, which either support only a signal transmission according to the standard USB 3.1 Generation 1 or a signal transmission according to the standard USB 3.1 Generation 1 and according to the standard USB 3.1 Generation 2. The latter can optionally be configured so that it supports both standards or only one of the two standards.

Furthermore, the USB interface 4 comprises an interface circuit 8. The interface circuit 8 creates an electrical connection between the USB host controller 5 and the USB port 6. To this end the interface circuit 8 comprises a first signal path 12a and a second signal path 12b that each have two data lines 13. The data lines 13 are adapted to transmit and to receive differential data signals via the USB interface 4. The first signal path 12a is used for the transmission of data to a peripheral device connected to the port 6, while the second signal path 12b is used to receive data from the peripheral device. The signal paths 12a, 12b thus enable full-duplex communication via the USB interface 4.

In this configuration, the system board 2 is a multilayer system board so that the data lines 13 run partly on an upper side 10 of the system board 2, on which there is arranged a predominant portion of components mounted on the system board 2, which are not shown, and partly on a lower side 11 facing away from the upper side 10 or on an intermediate layer 9 of the system board 2. The data lines 13 are described in detail by FIGS. 2 to 5.

The system board 2 is adapted to be equipped according to a first mounting option BO1 or according to a second mounting option BO2. The first mounting option BO1 is characterized in that a USB host controller 5 is mounted on the system board 2 that supports a signal transmission via the USB interface 4 according to the standard USB 3.1 Generation 1. The second mounting option BO2 is characterized in that the USB host controller 5 supports a signal transmission via the USB interface 4 according to the standard USB 3.1 Generation 2.

The interface circuit 8 as well as other details of the first mounting option BO1 and the second mounting option BO2 of the system board 2 are likewise described more precisely by FIGS. 2 to 5.

Figure 2:
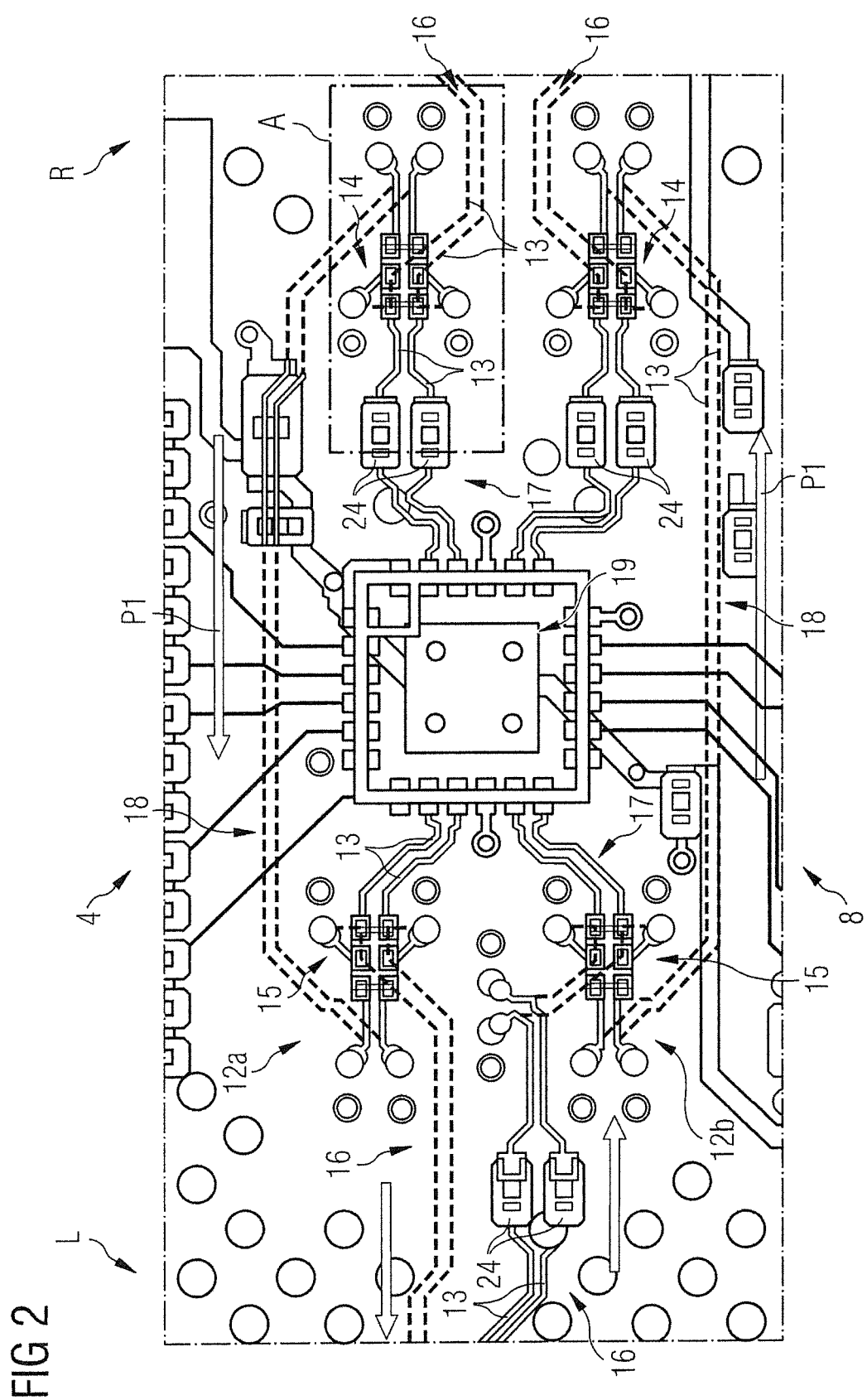
FIG. 2 shows a partial view of a system board with a USB interface according to an example in a first mounting option.
Figure 4:
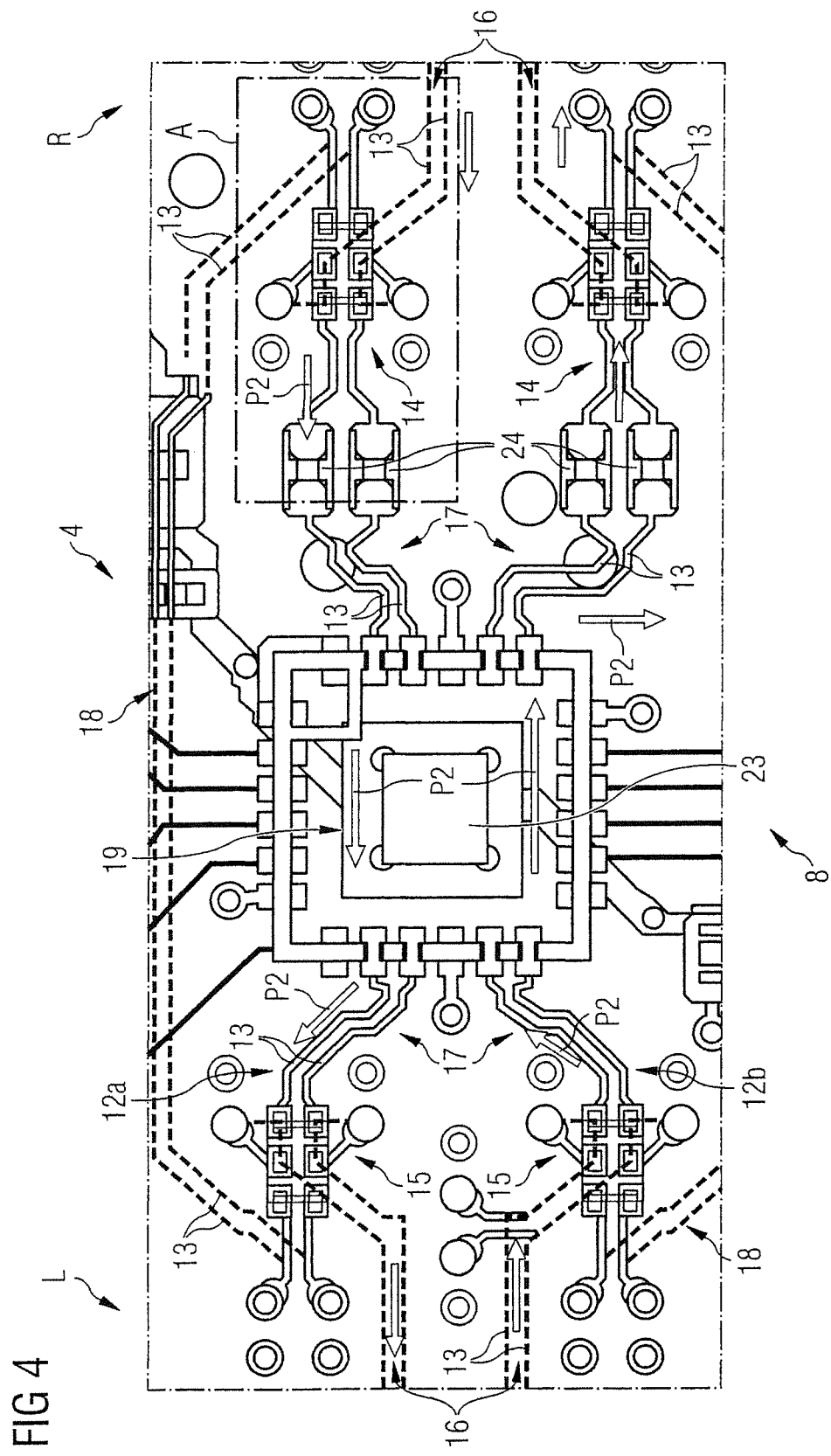
FIG. 4 shows a partial view of the system board with the USB interface according to FIG. 2 in a second mounting option.

FIG. 2 shows a partial view of a system board 2 with a USB interface 4 according to a configuration in a first mounting option BO1. FIG. 4 shows a partial view of the system board 2 according to FIG. 2 according to a second mounting option BO2. FIGS. 2 and 4 show in particular interface circuits 8 such as are used, for example, in the USB interface 4 according to FIG. 1. This means that, according to the first mounting option BO1, the USB host controller 5 is configured on the system board 2 according to FIG. 1 such that it supports a signal transmission via the USB interface 4 according to the standard USB 3.1 Generation 1, and according to the second mounting option BO2, the USB host controller 5 is configured on the system board 2 according to FIG. 1 such that it supports a signal transmission via the USB interface 4 according to the standard USB 3.1 Generation 2.

The interface circuit 8, as shown in FIGS. 2 and 4, comprises two signal paths 12a, 12b that each have two data lines 13 running in parallel. The data lines 13 running in parallel are each used for a differential signal transmission via the USB interface 4. The first signal path 12a and the second signal path 12b enable full-duplex communication via the USB interface 4, as described with reference to FIG. 1.

The data lines 13 of each signal path 12a, 12b each have a common portion 16, a first path 17 and a second path 18. In both signal paths 12a, 12b there are arranged respectively a first mounting location 14 and a second mounting location 15 for resistor arrays. At the first and second mounting locations 14, 15 the common portions 16 of the data lines 13 are divided into the first paths 17 and second paths 18 and brought together. The first and second mounting locations 14, 15 are described in detail by FIGS. 3 and 5.

Connected to a left side L of the interface circuit 8 shown in FIGS. 2 and 4 is a USB port not shown in these figures such as the USB port 6 according to FIG. 1, for example. A right side R of the interface circuit 8 shown in FIGS. 2 and 4 corresponds to a host side of the USB interface 4.

The interface circuit 8 further comprises a third mounting location 19 for a retimer or a redriver. According to the first mounting option BO1 shown in FIG. 2, no retimer or redriver is fitted at the third mounting location 19. According to the second mounting option BO2 shown in FIG. 4, a retimer 23 is fitted at the third mounting location 19. All mounting locations 14, 15, 19 have solder points for surface-mounted components, so-called pads.

According to the first mounting option BO1, that is when no retimer or redriver is fitted at the third mounting location 19, the common portions 16 of the data lines 13 are connected electrically to the data lines 13 of the second paths 18 at the first and the second mounting location 14, 15 so that data signals are conducted via the second paths 18 along the arrows P1 past the third mounting location 19. An example of such an electrical connection is described in detail by FIG. 3.

According to the second mounting option BO2, that is when a retime 23 is fitted at the third mounting location 19, the common portions 16 of the data lines 13 electrically connect to the data lines 13 of the first paths 17 at the first and the second mounting location 14, 15 so that data signals are conducted via the first paths 17 and thus also via the retimer 23 at the third mounting location 19 along the arrows P2. An example of such a connection is described in detail by FIG. 5.

Figure 3:
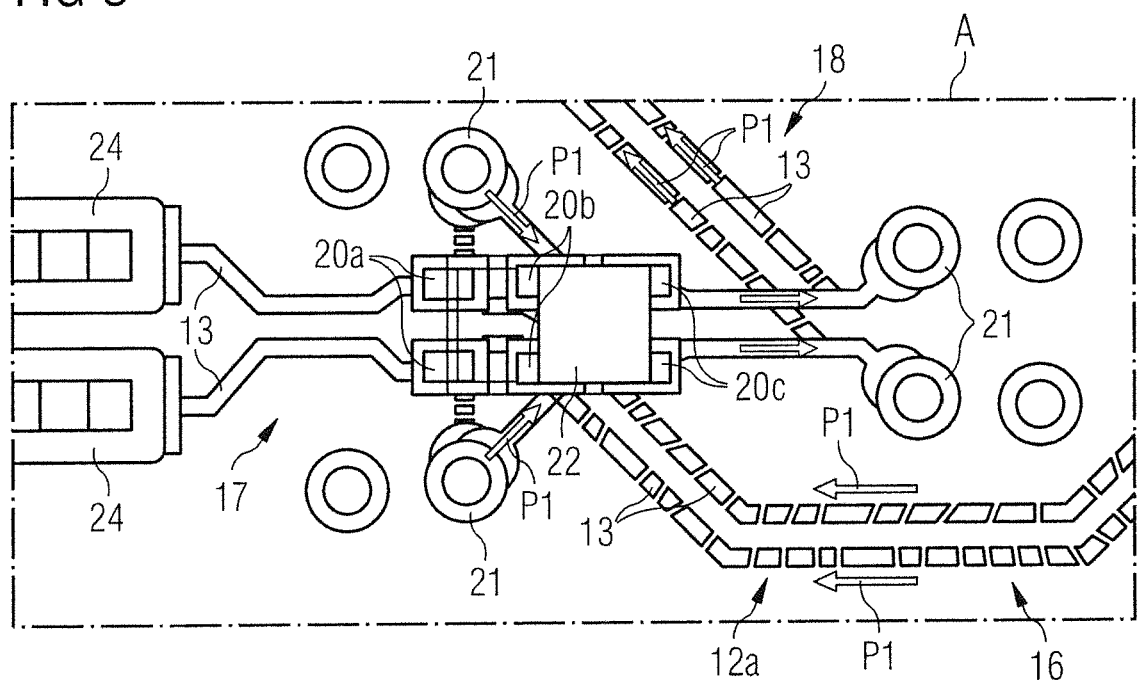
FIG. 3 shows a section of the partial view of the system board according to FIG. 2.
Figure 5:
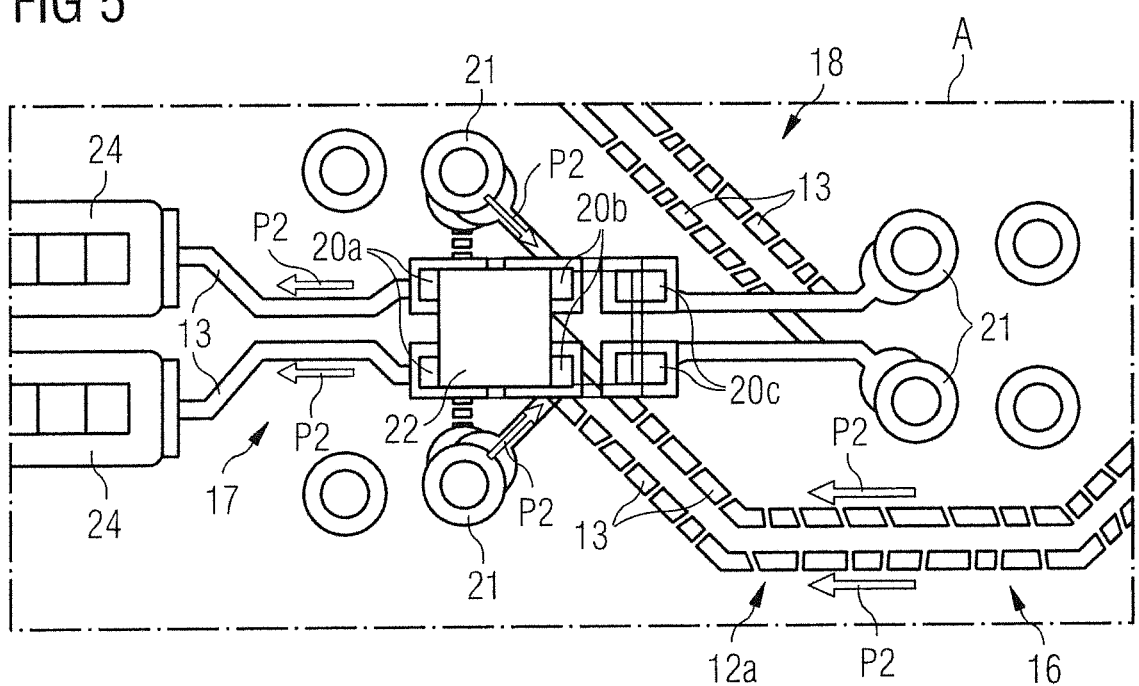
FIG. 5 shows a section of the partial view of the system board according to FIG. 4.

FIG. 3 shows a section of the partial view of the USB interface 4 according to FIG. 2. The area of the USB interface 4 shown in FIG. 3 is marked as area A in FIG. 2. FIG. 3 shows this section according to the first mounting option BO1. FIG. 5 shows the same area A, but according to FIG. 4 according to the second mounting option BO2.

The area A comprises one of the first mounting locations 14, a part of the common portion 16 of the data lines 13, and a part of one of the first paths 17 and a part of one of the second paths 18.

The first mounting location 14 consists of six pads 20a, b, c in all arranged in two parallel rows of three pads 20a, b, c each. Two central pads 20b fixedly electrically connect to respectively one of the data lines 13 of the common portion 16. Two pads 20a on a first side of the central pads 20b each electrically connect to the data lines 13 of the first path 17 and two other pads 20c on a second side of the central pads 20b electrically connect to the data lines 13 of the second path 18. These electrical connections of the pads 20a, b, c to the respective data lines 13 are a fixed constituent of the system board 2. In the system board itself the pads 20a, b, c are electrically isolated from one another.

The pads 20a, b, c are located on the upper side 10 of the system board 2. The first path 17 runs likewise on the upper side 10 of the system board 2. The common portion 16 of the data lines 13 and the second path 18 run from the pads 20b, c only as far as vias 21 recessed in the system board 2 on the upper side 10. The vias 21 are used as through-connections through the system board 2 so that a majority of the common portion 16 of the data lines 13 and of the second path 18 run on the lower side 11 of the system board 2. In this way the data lines 13 are led so that they contact the corresponding pads 20a, b, c without crossing one another or forming open line ends. Total reflections in the data lines 13 are thus prevented or at least reduced. In FIGS. 2 to 5, data lines 13 that run on the upper side 10 of the system board 2 are identified by continuous lines and data lines 13 that run on the lower side 11 of the system board 2 are identified by dashed lines.

The first mounting location 14 is fitted with a zero-ohm resistor array 22 in chip style. The zero-ohm resistor array 22 comprises two zero-ohm resistors arranged parallel to one another. The zero-ohm resistor array 22 has four contact points via which the zero-ohm resistor array 22 is soldered to four of the six pads 20a, b, c of the first mounting location 14.

According to the first mounting option BO1, the zero-ohm resistor array 22 electrically connects to the pads 20b and 20c. This is shown in FIG. 3. Each of the zero-ohm resistors thus produces an electrical connection between one data line 13 of the common portion 16 and one data line 13 of the second path 18.

According to the second mounting option BO2, the zero-ohm resistor array 22 electrically connects to the pads 20a and 20b. This is shown in FIG. 5. Each of the zero-ohm resistors thus produces an electrical connection between one data line 13 of the common portion 16 and one data line 13 of the first path 17.

The other first mounting location 14 and the second mounting locations 15 are fitted in an analogous manner with zero-ohm resistor arrays 22 so that, according to the first mounting option BO1, a continuous signal path is created over the common portion 16 and the second path 18 and according to the second mounting option BO2 a continuous signal path is created over the common portion 16 and the first path 17.

In FIGS. 2 to 5, capacitors 24 are also shown in the interface circuit 8. Alternatively, a number of components can be reduced by using capacitors corresponding to the capacitors 24 for electrical contacting of the pads 20a, b, c with one another instead of the zero-ohm resistors. Capacitors of this kind can also be combined in a capacitor array, which is then soldered in an analogous manner to four of the six pads of the first or second mounting locations.

The features of the USB interface 4 shown in FIGS. 1 to 5 can also be used in an analogous manner for other interfaces such as, for example, Thunderbolt interfaces, PCI Express interfaces, Serial ATA (Serial AT Attachment) interfaces and similar interfaces with comparably high or higher data transmission rates.

The invention claimed is:

1. An interface arrangement on a system board comprising:
at least two data lines for a differential signal transmission via the interface arrangement, at least one first mounting location for at least one first connector and at least one second mounting location for at least one second connector,
a third mounting location for an integrated circuit, and
a host controller that supports a signal transmission with a first data transmission rate or a second data transmission rate,
wherein
at the at least one first mounting location the data lines are divided into a first path and a second path,
at the at least one second mounting location, the second path and the first path are joined,
the third mounting location for the integrated circuit is arranged in the first path,
the at least one first connector and the at least one second connector can be mounted at the at least one first and at least one second mounting location in a first or a second position, respectively, so that signals in the data lines run via the first path or via the second path, and
in support of the first data transmission rate by the host controller, the third mounting location is unpopulated, and in support of the second data transmission rate by the host controller, an integrated circuit is fitted at the third mounting location, wherein the second data transmission rate is higher than the first data transmission rate.

2. The interface arrangement according to claim 1, wherein the interface arrangement is a USB interface arrangement and the host controller is a USB host controller that supports the signal transmission at the first data transmission rate according to standard USB 3.1 Gen. 1 and the signal transmission at the second data transmission rate according to standard USB 3.1 Gen. 2, and in support of the standard USB 3.1 Gen. 1 by the USB host controller, the third mounting location is unpopulated and in support of the standard USB 3.1 Gen. 2 by the USB host controller, an integrated circuit is fitted at the third mounting location.

3. The interface arrangement according to claim 1, wherein the at least one first connector and/or the at least one second connector comprises at least one surface-mounted component.

4. The interface arrangement according to claim 1, wherein the at least one first connector and/or the at least one second connector comprises two zero-ohm resistors that are combined to produce a chip resistor array.

5. The interface arrangement according to claim 1, wherein the at least one first connector and/or the at least one second connector comprises two capacitors.

6. The interface arrangement according to claim 1, wherein the at least one first connector and the at least one second connector are soldered in the first or the second position on the system board depending on whether an integrated circuit is fitted at the third mounting location or whether the third mounting location is unpopulated.

7. The interface arrangement according to claim 1, wherein the system board on which the interface arrangement is arranged is configured as a multilayer system board, the first path runs on an upper side of the system board on which side the system board is fitted with components, and the second path and a common portion of the data lines run at least predominantly on a lower side of the system board facing away from the upper side or along an intermediate layer of the system board.

8. The interface arrangement according to claim 1, wherein the at least one first mounting location and/or the at least one second mounting location comprise six pads, the six pads are arranged in two rows of three pads each running parallel to one another of which two central pads are electrically connected to a common portion of the data lines, and two pads on a first side are electrically connected to the data lines of the first path and two pads on a second side are electrically connected to the data lines of the second path.

9. The interface arrangement according to claim 1, wherein the integrated circuit is a retimer or a redriver.

10. A computer system comprising at least one system board with the at least one interface arrangement according to claim 1.

11. The computer system according to claim 10, wherein the at least one interface arrangement further comprises at least one port adapted to connect a peripheral device to the computer system.

* * * * *